(12) United States Patent
Mijuskovic et al.

(10) Patent No.: US 7,948,244 B2
(45) Date of Patent: May 24, 2011

(54) CAPACITIVE SENSORS INCLUDING GAIN AND ACTIVE-FILTERED SAMPLING STAGES

(75) Inventors: Dejan Mijuskovic, Chandler, AZ (US); Liviu Chiaburu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/507,497

(22) Filed: Jul. 22, 2009

(65) Prior Publication Data

US 2009/0278551 A1    Nov. 12, 2009

Related U.S. Application Data

(62) Division of application No. 11/627,633, filed on Jan. 26, 2007, now Pat. No. 7,583,088.

(51) Int. Cl.
  *G01R 27/26* (2006.01)
  *H03K 5/08* (2006.01)
(52) U.S. Cl. .................................. 324/658; 327/310
(58) Field of Classification Search .............. 324/658
  See application file for complete search history.

(56) References Cited

U.S. PATENT DOCUMENTS

| | | | |
|---|---|---|---|
| 5,633,594 A * | 5/1997 | Okada ........................... | 324/679 |
| 5,751,154 A | 5/1998 | Tsugai | |
| 5,864,456 A * | 1/1999 | Connor ........................ | 361/93.7 |
| 5,977,803 A * | 11/1999 | Tsugai ........................... | 327/94 |
| 5,986,497 A | 11/1999 | Tsugai | |
| 6,366,099 B1 * | 4/2002 | Reddi ........................... | 324/678 |
| 6,750,659 B2 | 6/2004 | Murphy | |
| 7,272,164 B2 | 9/2007 | Sorrells et al. | |
| 2002/0171454 A1 * | 11/2002 | Yakabe et al. ................. | 327/77 |
| 2004/0183551 A1 | 9/2004 | Itakura | |
| 2007/0012913 A1 | 1/2007 | Ohta et al. | |

FOREIGN PATENT DOCUMENTS

| | | |
|---|---|---|
| DE | 19855896 A1 | 12/1999 |
| EP | 2177880 A1 | 4/2010 |
| JP | 8327677 A | 12/1996 |
| JP | 11023608 | 1/1999 |
| WO | 2005124659 A1 | 12/2005 |
| WO | 2005124837 | 12/2005 |

OTHER PUBLICATIONS

Burnstein, A., et al., "Mixed Analog-Digital Highly-Sensitive Sensor Interface Circuit for Low-Cost Microsensors", 19950625; 19950625-19950629, vol. 1, pp. 162-165, Jun. 25, 1995.
EPC Search Report, PCT/US2008050480, mailed Feb. 16, 2011.

\* cited by examiner

*Primary Examiner* — Jeff Natalini
(74) *Attorney, Agent, or Firm* — Ingrassia Fisher & Lorenz, P.C.

(57) ABSTRACT

Embodiments of capacitive sensors (500, 600) and methods for reducing noise in capacitive sensors are provided. Embodiments of capacitive sensors include a gain stage (510, 610), a capacitive sensor output, and an active filtered-sampling stage (550, 650). The an active filtered-sampling stage includes a first resistive element (555, 655) coupled to the gain stage output, a second resistive element (565, 670) coupled to the capacitive sensor output, a node (560, 660) between the first and second resistive elements, and a switch (575, 675) selectively coupling the first node to an integrator circuit (550, 650), where the integrator circuit is coupled to the capacitive sensor output.

13 Claims, 4 Drawing Sheets

CAPACITIVE SENSORS INCLUDING GAIN AND ACTIVE-FILTERED SAMPLING STAGES

CROSS-REFERENCE TO RELATED APPLICATION

This application is a divisional of previous U.S. patent application Ser. No. 11/627,633, filed on Jan. 26, 2007, now issued as U.S. Pat. No. 7,583,088.

TECHNICAL FIELD

Embodiments generally relate to sensors, and more particularly relate to reducing noise in capacitive sensors.

BACKGROUND

Signals output by capacitive sensors often include noise from various components (e.g., noise from an operational amplifier, noise from one or more switches, etc.) of the capacitive sensor. Often, the noise component included in the output signals is large and represents a major limitation in achieving greater sensitivity in detecting changes in capacitance. Accordingly, it is desirable to provide systems and methods for generating output signals of a capacitive sensor with reduced amounts of noise. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

Embodiments of the present invention will hereinafter be described in conjunction with the following drawing figures, wherein like numerals denote like elements.

DETAILED DESCRIPTION

The following detailed description of the embodiments is merely exemplary in nature and is not intended to limit the inventive subject matter or the application and uses of the inventive subject matter. Furthermore, there is no intention to be bound by any theory presented in the preceding background or the following detailed description.

Figure 1:
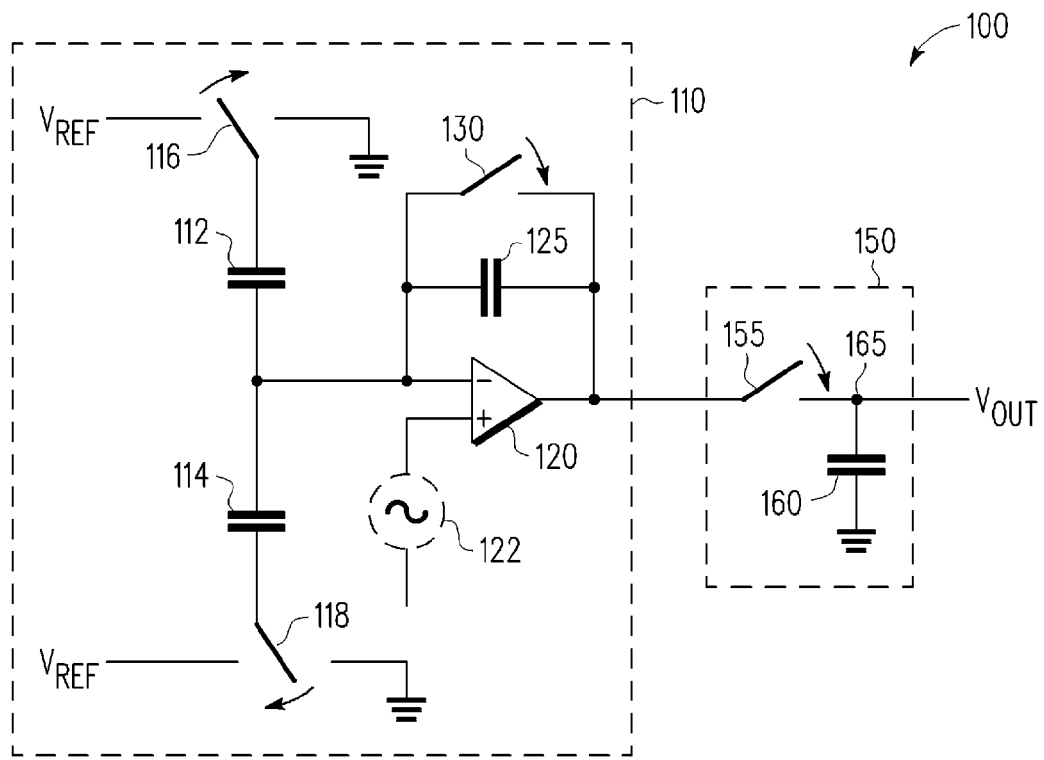
FIG. 1 is a schematic diagram of a known capacitive element sensor 100 having a gain stage coupled to a sampling stage.

FIG. 1 is a diagram of a prior art capacitive element sensor 100 including a gain stage 110 coupled to a stage 150. Gain stage 110 typically includes a capacitive element 112 having a measurable capacitance ($C_s$) and a capacitive element 114 having a reference capacitance ($C_{ref}$). Capacitive elements 112 and 114 are each selectively coupled to a reference voltage ($V_{ref}$) and ground via switches 116 and 118, respectively, such that only one of capacitive elements 112 and 114 is coupled to $V_{ref}$ and ground at any particular time. That is, when switch 116 couples capacitive element 112 to $V_{ref}$, switch 118 couples capacitive element 114 to ground. Similarly, when switch 118 couples capacitive element 114 to $V_{ref}$, switch 116 couples capacitive element 112 to ground.

Capacitive elements 112 and 114 are each coupled to an integrator circuit comprised of an operational amplifier 120 having a positive input, a negative input, and an output, and a capacitive element 125 having a capacitance ($C_{125}$) coupled to the negative input and to the output of operational amplifier 120. In addition, gain stage 110 includes a switch 130 so that signals may discharge capacitive element 125 when switch 130 is closed.

Stage 150 includes a switch 155 to selectively couple stage 150 to an output node 165 and a capacitive element 160. Capacitive element 160 is coupled between node 165 and ground.

The purpose of capacitive element sensor 100 is to produce a voltage output proportional to the capacitive difference of capacitive elements 112 and 114 (i.e., $C_s - C_{ref}$). The following is a description of how capacitive sensor 100 operates:

Switches 130 and 155 are closed, switch 116 is connected to $V_{ref}$, and switch 118 is connected to ground. This results in the output signal being equal to $V_{ref}$.

Switch 130 is opened, while switch 155 remains closed. This causes the instantaneous noise of capacitive sensor 100 to be sampled and held at capacitive element 125. Shortly after switch 130 is opened, switches 116 and 118 are switched so that voltage steps of $V_{ref}$ and $-V_{ref}$ are applied to capacitive elements 114 and 112, respectively. The change in charge (i.e., $V_{ref}*(C_s - C_{ref})$) is stored at capacitive element 125, which leads to a change in the output signal by the desired amount $V_{ref}*(C_s - C_{ref})/C_{125}$. Switch 155 is then opened so that the present value of the output signal is stored on capacitive element 160.

The change in the output signal also includes noise generated by operational amplifier 120, which noise is represented by a virtual noise source 122, and noise generated by the switching action of switch 130. Furthermore, the output signal stored in capacitive element 160 also includes noise generated by the switching action of switch 155. That is, while the ideal output signal is only $V_{ref}*(C_s - C_{ref})/C_{125}$, capacitive element 160 stores a signal comprised of several other components represented by the following equation: $V_{ref}*(C_s - C_{ref})/C_{125}$ plus operational amplifier 120 noise, plus switch 130 noise, plus switch 155 noise.

Figure 2:
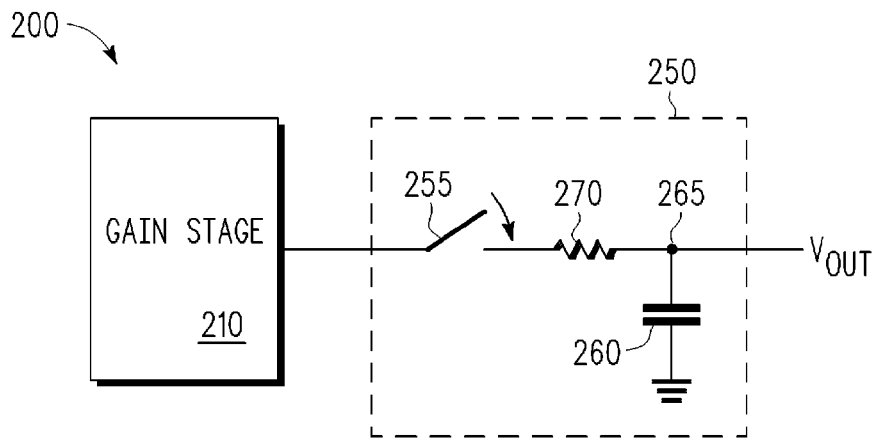
FIG. 2 is a schematic diagram of one exemplary embodiment of a capacitive sensor having a gain stage and a passive filtered-sampling stage.

FIG. 2 is a schematic diagram of one exemplary embodiment of a capacitive sensor 200 having a gain stage 210 and a passive filtered-sampling stage 250. Gain stage 210 may be any device, circuitry, hardware, and/or software capable of amplifying a signal. In the embodiment illustrated in FIG. 2, gain stage 210 is configured similar to gain stage 110 discussed above with respect to FIG. 1. That is, gain stage 210 generates an output signal having a substantially constant noise component when gain stage 210 is in a "hold" mode (discussed below).

Passive filtered-sampling stage 250 includes a switch 255 (e.g., a single pole, single throw switch (SPST)) to selectively couple passive filtered-sampling stage 250 to gain stage 210.

In addition, passive filtered-sampling stage 250 includes a resistive element 270 (e.g., a resistor) having a resistance in the range of about 10 kΩ to about 100 kΩ coupled in series with switch 255 and coupled to a node 265, wherein node 265 is also connected to the output of capacitive sensor 200.

Passive filtered-sampling stage 250 also includes a capacitive element 260 (e.g., a capacitor) coupled to node 265. Capacitive element 260 includes a capacitance in the range of about 2 pF to about 20 pF and is configured to sample a signal when switch 255 is closed and hold/store the signal when switch 255 is opened.

In an exemplary operational mode, capacitive sensor 200 is configured to output a signal having a $V_{ref}*(C_s-C_{ref})/C_{125}$ component with a reduced amount of noise. The following is a description of how capacitive sensor 200 operates:

Initially, switches 130 and 255 are closed, switch 116 is connected to $V_{ref}$, and switch 118 is connected to ground. This results in the output signal being equal to $V_{ref}$.

Switch 130 is opened, while switch 255 remains closed. Shortly after switch 130 is opened, switches 116 and 118 are switched so that voltage steps of $V_{ref}$ and $-V_{ref}$ are applied to capacitive elements 114 and 112, respectively.

The change in charge (i.e., $C_s-C_{ref}$) is stored at capacitive element 125, which leads to a change in the output signal by the desired amount of $V_{ref}*(C_s-C_{ref})/C_{125}$. Switch 255 is then opened so that the present value of the output signal is stored on capacitive element 260.

The addition of a relatively large resistive element 270 between switch 255 and capacitive element 260 forms a low pass filter that attenuates the noise created by operational amplifier 120, switch 130, and/or switch 255. That is, it has been found that capacitive sensor 200 is approximately an 8 dB improvement over capacitive sensor 100.

Figure 3:
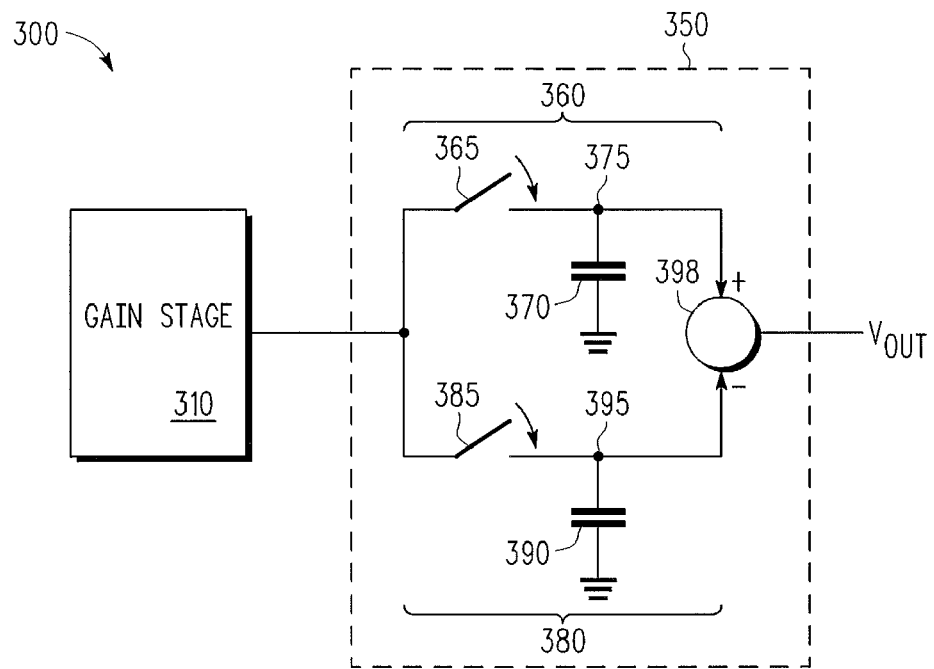
FIG. 3 is a schematic diagram of another exemplary embodiment of a capacitive sensor having a gain stage and a passive filtered-sampling stage.

FIG. 3 is a schematic diagram of another exemplary embodiment of a capacitive sensor 300 having a gain stage 310 and a passive filtered-sampling stage 350, wherein gain stage 310 is configured similar to gain stage 210 discussed above with reference to FIG. 2. As illustrated in FIG. 3, passive filtered-sampling stage 350 includes a branch 360 coupled in parallel with a branch 380.

Branch 360 includes a switch 365 (e.g., a SPST switch) selectively coupling branch 360 to gain stage 310. Switch 365 is also coupled to a capacitive element 370 (e.g., a capacitor) having a capacitance in the range of about 2 pF to about 20 pF via a node 375. Capacitive element 370 is configured to sample a signal from gain stage 310 when switch 365 is closed and to hold/store the signal when switch 365 is opened.

Branch 380 includes a switch 385 (e.g., a SPST switch) selectively coupling branch 380 to gain stage 310. Switch 385 is also coupled to a capacitive element 390 (e.g., a capacitor) having a capacitance in the range of about 2 pF to about 20 pF via a node 395. Capacitive element 390 is configured to sample a signal from gain stage 310 when switch 385 is closed and to hold/store the signal when switch 385 is opened.

Passive filtered-sampling stage 350 also includes a subtractor 398 coupled to nodes 375 and 395, and coupled to the output ($V_{out}$) of capacitive sensor 300. As illustrated in FIG. 3, subtractor 398 is configured to subtract a signal held on capacitive element 390 from a signal held on capacitive element 370. However, various embodiments contemplate that subtractor 398 may be configured to subtract a signal held on capacitive element 370 from a signal held on capacitive element 390.

In an exemplary operational mode, capacitive sensor 300 is configured to output a signal having a $V_{ref}*(C_s-C_{ref})/C_{125}$ component with a reduced amount of noise. The following is a description of how capacitive sensor 300 operates:

Initially, switches 130, 365, and 385 are each open, switch 116 is connected to $V_{ref}$, and switch 118 connected to ground. Switch 130 is then closed to reset the circuit.

Switch 130 is opened and switch 385 is closed, while switch 365 remains open. This generates a signal ($V_1$) from gain stage 310, wherein $V_1$ includes noise from operational amplifier 120 and noise from the switching action of switch 130. The $V_1$ signal is then sampled by capacitive element 390.

Switch 385 is opened so that the $V_1$ signal is held on capacitive element 390, and now the held $V_1$ signal also includes noise from the switching action of switch 385. Shortly thereafter, switches 116 and 118 are switched so that voltage steps of $V_{ref}$ and $-V_{ref}$ are applied to capacitive elements 114 and 112, respectively.

Switch 365 is then closed so that gain stage 310 generates a signal ($V_2$) having a $V_{ref}*(C_s-C_{ref})/C_{125}$ component, noise from operational amplifier 120, and noise from the switching action of switch 130. The $V_2$ signal is then sampled by capacitive element 370, and switch 365 is opened so that the signal $V_2$ signal is held on capacitive element 370 (which held $V_2$ signal also includes noise from the switching action of switch 365).

Subtractor 398 then subtracts the held $V_1$ signal from the held $V_2$ signal. Accordingly, the output signal from capacitive sensor 300 has the $V_{ref}*(C_s-C_{ref})/C_{125}$ component with a reduced amount of noise. That is, $V_2-V_1 \rightarrow [V_{ref}*(C_s-C_{ref})/C_{125}$ plus operational amplifier 120 noise, plus switch 130 noise, plus switch 365 noise] minus [operational amplifier 120 noise plus switch 130 noise, plus switch 385 noise] equals $V_{ref}*(C_s-C_{ref})/C_{125}$ (plus switch 365 noise minus switch 385 noise). Accordingly, the output signal substantially equals $V_{ref}*(C_s-C_{ref})/C_{125}$, which has been shown to be a 4 dB improvement over the output of capacitive sensor 100.

Notably, as suggested above, the operation of branches 360 and 380 may be reversed. That is, passive filtered-sampling stage 350 may be configured such that capacitive element 370 holds $V_1$ and capacitive element 390 holds $V_2$ while subtractor 398 subtracts the signal ($V_1$) held on capacitive element 370 from the signal ($V_2$) held on capacitive element 390 to obtain an output signal of $V_{ref}*(C_s-C_{ref})/C_{125}$.

Figure 4:
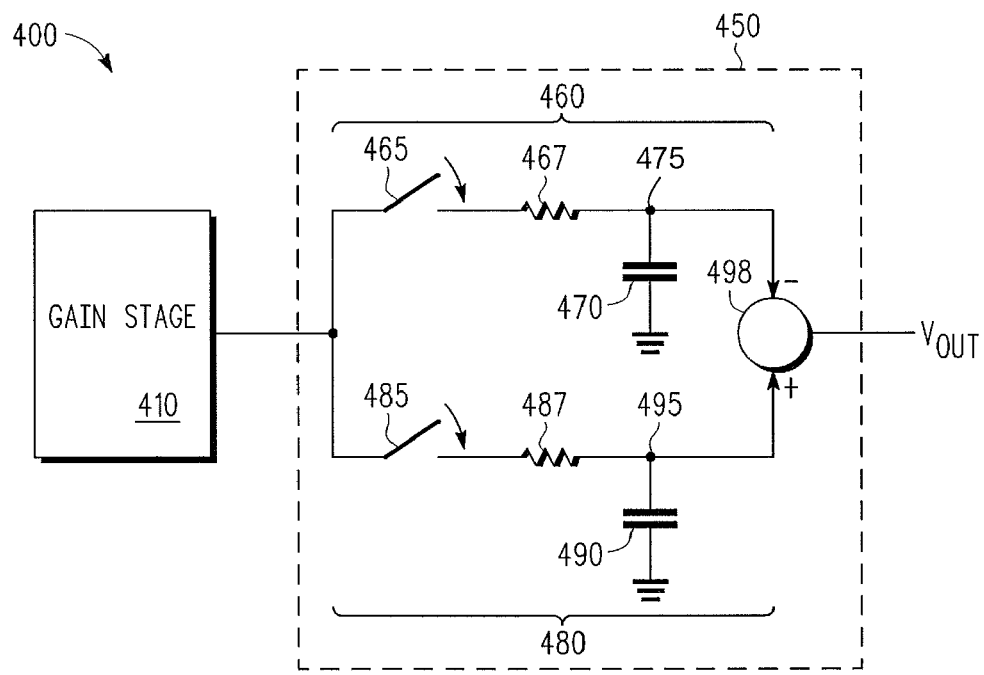
FIG. 4 is a schematic diagram of yet another exemplary embodiment of a capacitive sensor having a gain stage and a passive filtered-sampling stage.

FIG. 4 is a schematic diagram of yet another exemplary embodiment of a capacitive sensor 400 having a passive gain stage 410 and a passive filtered-sampling stage 450, wherein gain stage 410 is configured similar to gain stage 210 discussed above with reference to FIG. 2. As illustrated in FIG. 4, gain stage 410 includes a branch 460 coupled in parallel with a branch 480.

Branch 460 includes a switch 465 (e.g., a SPST switch) selectively coupling branch 460 to gain stage 410. Switch 465 is coupled in series with a resistive element 467 (e.g., a resistor) having a resistance in the range of about 10 kΩ to about 100 kΩ. Resistive element 467 is coupled to a capacitive element 470 (e.g., a capacitor) having a capacitance in the range of about 2 pF to about 20 pF via a node 475, wherein capacitive element 470 is configured to sample a signal from gain stage 410 when switch 465 is closed and hold/store the signal when switch 465 is opened.

Branch 480 includes a switch 485 (e.g., a SPST switch) selectively coupling branch 480 to gain stage 410. Switch 485 is coupled in series with a resistive element 487 (e.g., a resistor) having a resistance in the range of about 10 kΩ to about 100 kΩ. Resistive element 487 is coupled to a capacitive element 490 (e.g., a capacitor) having a capacitance in the range of about 2 pF to about 20 pF via a node 495, wherein capacitive element 490 is configured to sample a signal from gain stage 410 when switch 485 is closed and hold/store the signal when switch 485 is opened.

Passive filtered-sampling stage 450 also includes a subtractor 498 coupled to nodes 475 and 495, and coupled to the output ($V_{out}$) of capacitive sensor 400. As illustrated in FIG. 4, subtractor 498 is configured to subtract a signal held on capacitive element 490 from a signal held on capacitive element 470. However, various embodiments contemplate that subtractor 498 may be configured to subtract a signal held on capacitive element 470 from a signal held on capacitive element 490.

In an exemplary operational mode, capacitive sensor 400 is configured to output a signal having a $V_{ref}*(C_s-C_{ref})/C_{125}$ component with a reduced amount of noise. To accomplish such, capacitive sensor 400 operates as follows:

Initially, switches 130, 465, and 485 are each open, switch 116 is connected to $V_{ref}$, and switch 118 connected to ground. Switch 130 is then closed to reset the circuit.

Switch 130 is opened and switch 465 is closed (switch 485 remains open) so that gains stage 410 generates a signal ($V_1$) including noise from operational amplifier 120 and noise from the switching action of switch 130. The $V_1$ signal is sampled by capacitive element 470 and switch 465 is opened so that the $V_1$ signal is held on capacitive element 470, wherein the held $V_1$ signal also includes noise from the switching action of switch 465.

Shortly thereafter, switches 116 and 118 are switched so that voltage steps of $V_{ref}$ and $-V_{ref}$ are applied to capacitive elements 114 and 112, respectively. Switch 485 is then closed so that gain stage 410 generates a signal ($V_2$) having a $V_{ref}*(C_s-C_{ref})/C_{125}$ component, noise from operational amplifier 120, and noise from the switching action of switch 130.

The $V_2$ signal is sampled by capacitive element 490 and switch 485 is opened so that the $V_2$ signal is held on capacitive element 490 (which held $V_2$ signal also includes noise from the switching action of switch 485). Subtractor 498 subtracts the held $V_1$ signal from the held $V_2$ signal so that the output signal from capacitive sensor 400 has the $V_{ref}*(C_s-C_{ref})/C_{125}$ component. That is, $V_2-V_1 \rightarrow [V_{ref}*(C_s-C_{ref})/C_{125}$ plus operational amplifier 120 noise, plus switch 130 noise, plus switch 485 noise] minus [operational amplifier 120 noise plus switch 130 noise, plus switch 465 noise] equals $V_{ref}*(C_s-C_{ref})/C_{125}$ plus switch 485 noise minus switch 465 noise.

The addition of resistive elements 467 and 487 attenuates the noise generated by operational amplifier 120, switch 130, switch 465, and/or switch 485. Accordingly, output signals of capacitive sensor 400 substantially equal $V_{ref}*(C_s-C_{ref})/C_{125}$, which has been shown to be a 12 dB improvement over the output of capacitive sensor 100.

Notably, as suggested above, the operation of branches 460 and 480 may be reversed. That is, passive filtered-sampling stage 450 may be configured such that capacitive element 490 holds $V_1$ and capacitive element 470 holds $V_2$ while subtractor 498 subtracts the signal ($V_1$) held on capacitive element 490 from the signal ($V_2$) held on capacitive element 470 to obtain an output signal of $V_{ref}*(C_s-C_{ref})/C_{125}$.

Figure 5:
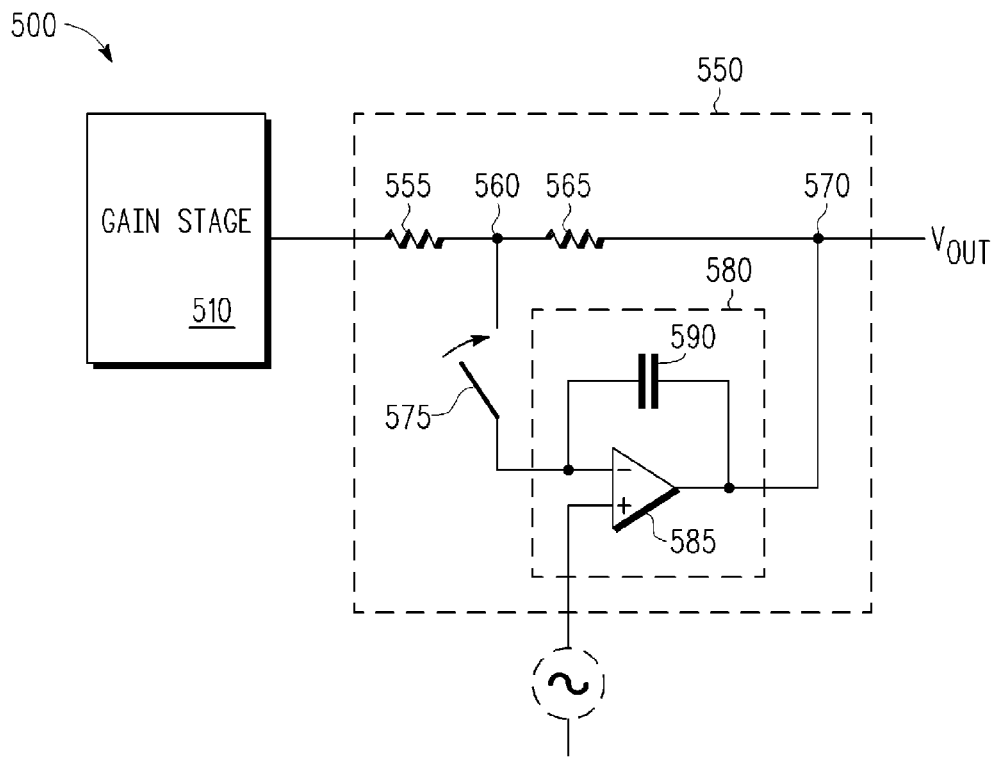
FIG. 5 is a schematic diagram of one exemplary embodiment of a capacitive sensor having a gain stage and an active filtered-sampling stage.

FIG. 5 is a schematic diagram of one exemplary embodiment of a capacitive sensor 500 having a gain stage 510 and an active filtered-sampling stage 550, wherein gain stage 510 is configured similar to gain stage 210 discussed above with reference to FIG. 2. Active filtered-sampling stage 550 includes a resistive element 555 (e.g., a resistor) having a resistance in the range of about 10 kΩ to about 100 kΩ coupled to gain stage 510 and to a node 560.

Node 560 is also coupled to a resistive element 565 (e.g., a resistor) having a resistance in the range of about 10 kΩ to about 100 kΩ, wherein resistive elements 565 and 555 may have substantially the same amount of resistance. Furthermore, resistive element 565 is coupled to a node 570, wherein node 570 is coupled to an output ($V_{out}$) of capacitive sensor 500.

In addition, node 560 is selectively coupled to an integrator circuit 580 via a switch 575 (e.g., a SPST switch). Integrator circuit 580 includes an operational amplifier 585 (similar to operational amplifier 120) having a negative input, a positive input, and an output, and a capacitive element 590 (e.g., a capacitor) coupled to the negative input and to the output of operational amplifier 585. Additionally, the output of operational amplifier 585 and capacitive element 590 are each coupled to node 570.

In an exemplary operational mode, capacitive sensor 500 is configured to output a signal having a $V_{ref}*(C_s-C_{ref})/C_{125}$ component with a reduced amount of noise. To accomplish such, capacitive sensor 500 operates as follows:

Initially, switches 130 and 575 are each open, switch 116 is connected to $V_{ref}$, and switch 118 connected to ground. Switches 130 and 575 are then closed and shortly thereafter, switches 116 and 118 are switched so that voltage steps of $V_{ref}$ and $-V_{ref}$ are applied to capacitive elements 114 and 112, respectively. This results in gain stage 510 generating a signal ($V_1$) having a $V_{ref}*(C_s-C_{ref})/C_{125}$ component, noise from operational amplifier 120, noise from switch 130, and noise from switch 575 (i.e., $V_1=[V_{ref}*(C_s-C_{ref})/C_{125}]$ plus operational amplifier 120 noise, plus switch 130 noise, plus switch 575 noise).

The $V_1$ signal is sampled by capacitive element 590, and switches 130 and 575 are each opened so that a signal ($V_2$) having operational amplifier 585 noise is subtracted from the $V_1$ signal. Accordingly, the output signal ($V_{out}$) of capacitive sensor 500 is $V_1-V_2$ (i.e., $[V_{ref}*(C_s-C_{ref})/C_{125}]$ plus operational amplifier 120 noise, plus switch 130 noise, plus switch 575 noise, minus operational amplifier 585 noise→$V_{out}$ equals $V_{ref}*(C_s-C_{ref})/C_{125}$ plus switch 130 noise, plus switch 575 noise).

Resistive element 555 and capacitive element 590 form a low pass filter that attenuates the noise created by operational amplifier 120, switch 130, and/or switch 575. That is, it has been found that capacitive sensor 500 is approximately an 8 dB improvement over capacitive sensor 100.

Figure 6:
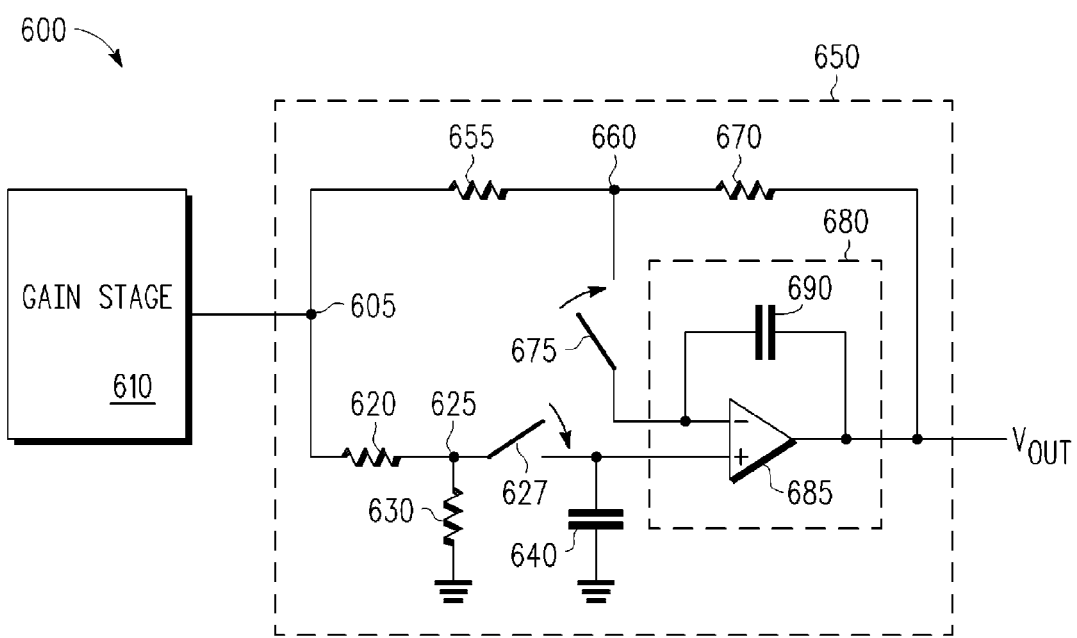
FIG. 6 is a schematic diagram of another exemplary embodiment of a capacitive sensor having a gain stage and an active filtered-sampling stage.

FIG. 6 is a schematic diagram of another exemplary embodiment of a capacitive sensor 600 having a gain stage 610 and an active filtered-sampling stage 650, wherein gain stage 610 is configured similar to gain stage 210 discussed above with reference to FIG. 2. Active filtered-sampling stage 650 includes a resistive element 620 (e.g., a resistor) coupled to gain stage 610 via a node 605 and coupled to a node 625. Node 625 is also coupled to a resistive element 630 (e.g., a resistor) having a resistance in the range of about 10 kΩ to about 100 kΩ, wherein resistive element 630 is also coupled to ground.

Furthermore, active filtered-sampling stage 650 includes a switch (e.g., a SPST switch) selectively coupling node 625 to a node 635. Node 635 is also coupled to an integrator circuit 680 and a capacitive element 640 (e.g., a capacitor) having a capacitance in the range of about 2 pF to about 20 pF, wherein capacitive element 640 is also coupled to ground.

Integrator circuit 680 includes an operational amplifier 685 having a negative input, a positive input, and an output, and a capacitive element 690 (e.g., a capacitor) coupled to the negative input and to the output of operational amplifier 685, wherein capacitive elements 640 and 690 may have substantially the same amount of capacitance. Moreover, the positive input of operational amplifier 685 is coupled to node 635.

Active filtered-sampling stage 650 also includes a resistive element 655 (e.g., a resistor) having a resistance in the range of about 10 kΩ to about 100 kΩ coupled to gain stage 610 via node 605 and coupled to a node 660. Node 660 is also coupled to a resistive element 665 having a resistance in the range of about 10 kΩ to about 100 kΩ, wherein resistive elements 665 and 655 have substantially the same amount of resistance. Furthermore, resistive element 665 is coupled to a node 670, wherein node 670 is coupled to an output of capacitive sensor 600.

In addition, node 660 is selectively coupled to an integrator circuit 680 via a switch 675 (e.g., a SPST switch). Additionally, node 670 is coupled to the output of operational amplifier 685 and to capacitive element 690.

In an exemplary operational mode, capacitive sensor 600 is configured to output a signal having a $V_{ref}*(C_s-C_{ref})/C_{125}$ component with a reduced amount of noise. To accomplish such, capacitive sensor 600 operates as follows:

Initially, switches 130, 627, and 675 are each open, switch 116 is connected to $V_{ref}$, and switch 118 connected to ground. Switch 130 is then closed to reset the circuit.

Switch 130 is opened and switch 627 is closed (switch 675 remains open) so that gains stage 610 generates a signal ($V_1$) including noise from operational amplifier 120 and noise from the switching action of switch 130.

The $V_1$ signal is sampled by capacitive element 640, and switch 627 is opened so that the signal $V_1$ is held on capacitive element 640, which held $V_1$ signal also includes noise from the switching action of switch 627. Shortly thereafter, switches 116 and 118 are switched so that voltage steps of $V_{ref}$ and $-V_{ref}$ are applied to capacitive elements 114 and 112, respectively.

Switch 675 is then closed so that gain stage 610 generates a signal ($V_2$) having a $V_{ref}*(C_s-C_{ref})/C_{125}$ component, noise from operational amplifier 120, and noise from the switching action of switch 130. The $V_2$ signal is sampled by capacitive element 690, and switch 675 is opened so that the signal $V_2$ is held on capacitive element 690 (which held $V_2$ signal also includes noise from the switching action of switch 675).

Operational amplifier 685 subtracts $V_1$ from $V_2$ so that output signals ($V_{out}$) from capacitive sensor 600 have the $V_{ref}*(C_s-C_{ref})/C_{125}$ component. That is, $V_2-V_1 \rightarrow [V_{ref}*(C_s-C_{ref})/C_{125}$ plus operational amplifier 120 noise, plus switch 130 noise, plus switch 675 noise] minus [operational amplifier 120 noise plus switch 130 noise, plus switch 627 noise] equals $V_{ref}*(C_s-C_{ref})/C_{125}$ plus switch 675 noise minus switch 627 noise.

Since switches 627 and 675 are similar, the noise generated by the switching action of these respective switches is considered substantially the same so that the switch 675 noise minus switch 627 noise component of the output signals is considered to equal zero. Accordingly, the output signal of capacitive sensor 600 substantially equals $V_{ref}*(C_s-C_{ref})/C_{125}$, which has been shown to be a 12 dB improvement over the output of capacitive sensor 100.

Figure 7:
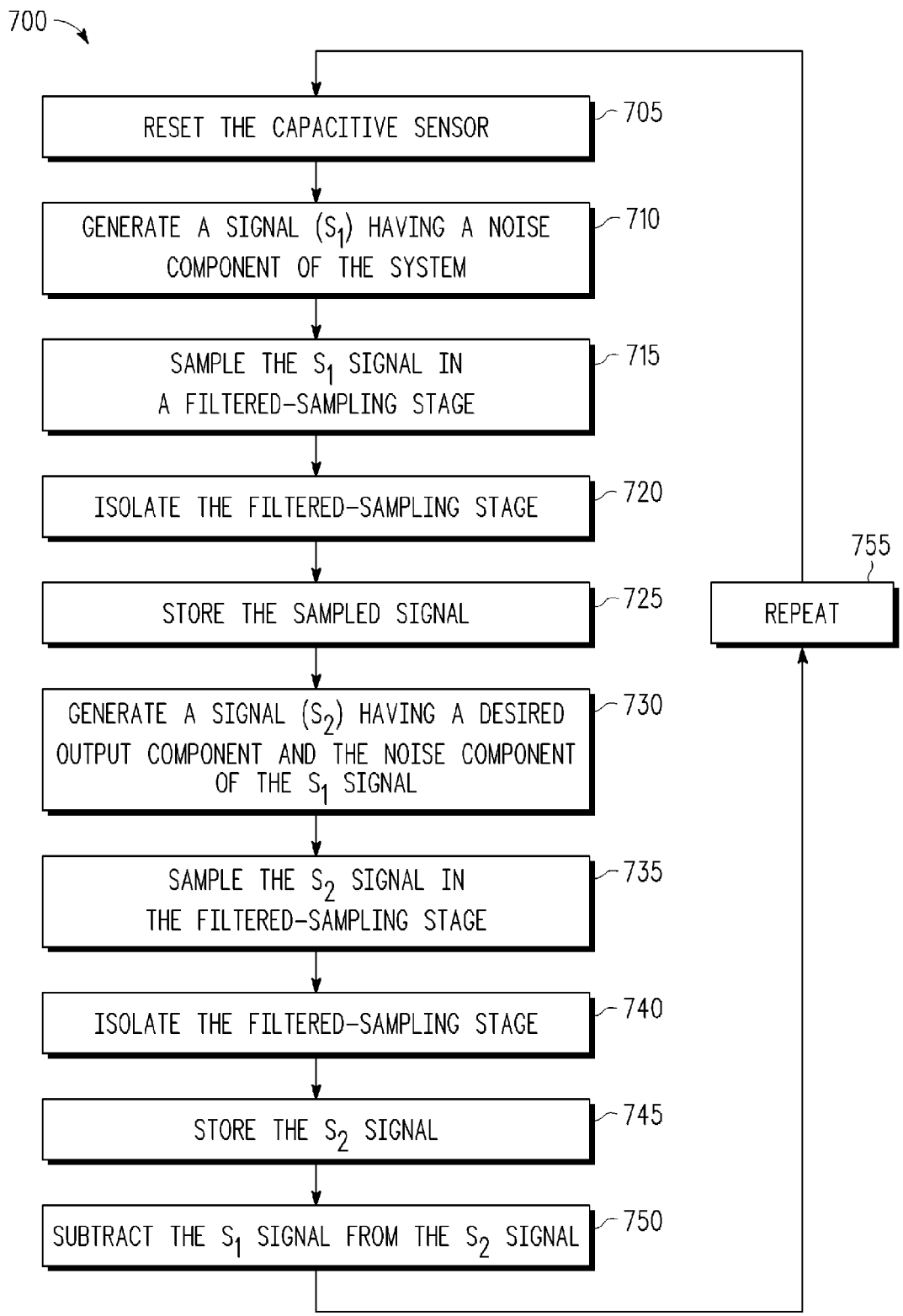
FIG. 7. is a flow diagram representing one exemplary embodiment of a method for reducing noise in a capacitive sensor.

FIG. 7 is a flow diagram representing one exemplary embodiment of a method 700 for reducing noise in a capacitive sensor (e.g., capacitive sensors 200, 300, 400, 500, and 600). Method 700 begins by resetting/clearing the capacitive sensor (block 705) and generating a signal (e.g., $S_1$) having a noise component (e.g., operational amplifier 120 noise, switch 130 noise, etc.) in a gain stage (e.g., gain stages 210, 310, 410, 510, and 610) (block 710).

The $S_1$ signal is sampled by a component (e.g., capacitors 260, 370, 390, 470, 490, 590, and 640) of a filtered-sampling stage (e.g., filtered-sampling stages 250, 350, 450, 550, and 650) (block 715). The component of the filtered-sampling stage is isolated from the gain stage (block 720) and the $S_1$ signal is at least temporarily stored in the component of the filtered-sampling stage (block 725).

A signal (e.g., $S_2$) having a desired output (e.g., $V_{ref}*(C_s-C_{ref})/C_{125}$) component and the noise included in the $S_1$ signal is generated in the gain stage (block 730) and sampled by a different component (e.g., capacitors 370, 390, 470, 490, 590, and 640) of the filtered-sampling stage (block 735). The component is isolated from the gain stage (block 740) and the $S_2$ signal is at least temporarily stored in the portion of the filtered-sampling stage (block 745).

The $S_1$ signal is subtracted (e.g., via subtractors 398 and 498, or via operational amplifiers 585 and 685) from the $S_2$ signal so that the output signal of the capacitive sensor includes the $V_{ref}*(C_s-C_{ref})/C_{125}$ component with a reduce amount of noise (block 750). Since the amount a noise generated by the various components of the gain stage may change over time, the method defined by blocks 710-750 may be repeated for each output signal of the capacitive sensor (block 755).

In summary, various exemplary embodiments provide a capacitive sensor comprising a gain stage including an output, the gain stage configured to generate a first signal having a noise component and generate a second signal having an output component of the gain stage and the noise component. The capacitive sensor also includes a filtered sampling stage having an input coupled to the gain stage output, the filtered-sampling stage configured to sample the first signal, store the first signal, and subtract the first signal from the second signal. Furthermore, a resistive element of the resistive element-capacitive element, in one embodiment, includes about 100 kΩ of resistance.

In one embodiment, the filter-sampling stage comprises a passive low pass filter. In another embodiment, the filtered-sampling stage includes a switch selectively coupling the filtered-sampling stage input to the gain stage output and a resistive element-capacitive element circuit coupled to the switch.

The filtered-sampling stage, in another exemplary embodiment, includes a subtractor, a first branch having an input and an output coupled to the subtractor, and a second branch having an input and an output coupled to the subtractor, the second branch coupled in parallel with a first branch. In this embodiment, the first branch includes a first switch selectively coupling the first branch to the gain stage output, and a first capacitive element coupled to the first switch, the subtractor, and to ground, and the second branch includes a second switch selectively coupling the second branch to the gain stage output, and a second capacitive element coupled to the second switch, the subtractor, and to ground. In this embodiment, the first capacitive element may be configured to sample the first signal when the first switch is closed and also store the first signal after the first switch is opened. Similarly, the second capacitive element may be configured to sample the second signal when the second switch is closed and store the second signal after the second switch is opened. Furthermore, the subtractor may be configured to subtract the first signal from the second signal.

In another exemplary embodiment, the filtered-sampling stage includes a subtractor, a first branch having an input and an output coupled to the subtractor, and a second branch having an input and an output coupled to the subtractor, the second branch coupled in parallel with a first branch. In this embodiment, the first branch includes a first switch selectively coupling the first branch to the gain stage output, and a first resistive element-capacitive element circuit coupled to the first switch, the subtractor, and to ground. Similarly, the second branch includes a second switch selectively coupling the second branch to the gain stage output, and a second resistive element-capacitive element circuit coupled to the second switch, the subtractor, and to ground. In accordance with one aspect of this embodiment, a resistive element in one of the first resistive element-capacitive element circuit and the second resistive element-capacitive element circuit includes about 100 kΩ of resistance.

Another exemplary embodiment provides a capacitive sensor including an output and having a gain stage including a gain stage output, the capacitive sensor comprising an active filtered-sampling stage having an input coupled to the gain stage output. In one aspect of this embodiment, the active filtered-sampling includes a first resistive element having an input coupled to the output of the gain circuit and having an output coupled to a first node, a second resistive element having an input coupled to the first node and an output coupled to the capacitive sensor output, and a first switch selectively coupling the first node to a integrator circuit, wherein the integrator circuit is coupled to the capacitive sensor output.

In one embodiment of the capacitive sensor, the gain stage includes a first operational amplifier, the integrator circuit includes a second operational amplifier having a positive input, a negative input, and an operational amplifier output, and the integrator circuit includes a first capacitive element coupled to the negative input and the operational amplifier output. In accordance with one aspect of this embodiment, the active filtered-sampling stage further includes a third resistive element having an input coupled to the output of the gain circuit and having an output coupled to a second node, a fourth resistive element having an input coupled to the second node and an output coupled to ground, a second switch selectively coupling the second node to a third node, and a second capacitive element having an input coupled to the third node and an output coupled to ground, wherein the third node is coupled to the positive input of the operational amplifier. In another aspect, the first resistive element, the second resistive element, the third resistive element, and the fourth resistive element each include substantially the same amount of resistance, and the first capacitive element and the second capacitive element have substantially the same amount of capacitance. In yet another aspect, the first operational amplifier and the second operational amplifier each generate substantially the same amount of noise.

A method for reducing noise in a sensor having a gain stage is also provided in various other exemplary embodiments. The method includes generating a first signal having a first noise component of the gain stage, storing the first signal, generating a second signal comprising an output component of the gain stage and the first noise component, and subtracting the first signal from the second signal. In accordance with one aspect of this embodiment, storing the first signal includes temporarily storing the first signal until the next time the sensor is reset.

In accordance with another exemplary embodiment, the method further includes resetting the sensor, generating a third signal having a second noise component different from the first noise component, storing the third signal, generating a fourth signal comprising the output component and the second noise component, and subtracting the third signal from the fourth signal.

The first signal, in one embodiment, is stored in a first capacitive element, the method further comprising isolating the first capacitive element from the gain stage prior to generating the second signal. In another embodiment, the method further includes storing the second signal in a second capacitive element, and isolating the second capacitive element, wherein the second signal is stored and the second capacitive element is isolated prior to subtracting the first signal from the second signal.

In accordance with another exemplary embodiment, generating the second signal comprises generating the second signal utilizing an integrator circuit. The first noise component, in one aspect of this embodiment, is noise of the integrator circuit. In another aspect, resetting includes isolating the integrator circuit and adding the unity gain noise to the first signal.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the inventive subject matter as set forth in the appended claims and their legal equivalents.

We claim:

1. A capacitive sensor including a capacitive sensor output and having a gain stage including a first capacitive element, a second capacitive element, a first operational amplifier, and a gain stage output, the capacitive sensor comprising:
   an active filtered-sampling stage having an input coupled to the gain stage output, the active filtered-sampling stage including:
   a first resistive element having an input coupled to the gain stage output and having an output coupled to a first node;
   a second resistive element having an input coupled to the first node and an output coupled to the capacitive sensor output; and
   a first switch selectively coupling the first node to a second operational amplifier of an integrator circuit, wherein the integrator circuit is coupled to the capacitive sensor output and wherein during normal operations in which the capacitive sensor is to produce a voltage output proportional to a capacitive difference of the first and second capacitive elements, the first switch is controlled, at a first time, to couple the first node to the second operational amplifier, resulting in the integrator circuit sampling a first signal that includes noise from the first operational amplifier, and the first switch is controlled, at a second time, to decouple the first node from the second operational amplifier, resulting in a second signal that includes noise from the second operational amplifier being subtracted from the first signal so that an output signal produced at the capacitive sensor output includes noise from the first operational amplifier plus noise from the first switch minus noise from the second operational amplifier.

2. The capacitive sensor of claim 1, wherein the first resistive element and the second resistive element each include substantially the same amount of resistance.

3. The capacitive sensor of claim 1, wherein the first resistive element and the second resistive element each have a resistance in a range of 10 kΩ to 100 kΩ.

4. A capacitive sensor including a capacitive sensor output and having a gain stage including a first operational amplifier and a gain stage output, the capacitive sensor comprising:

an active filtered-sampling stage having an input coupled to the gain stage output, the active filtered-sampling stage including:
  a first resistive element having an input coupled to the gain stage output and having an output coupled to a first node;
  a second resistive element having an input coupled to the first node and an output coupled to the capacitive sensor output;
  a first switch selectively coupling the first node to an integrator circuit, wherein the integrator circuit is coupled to the capacitive sensor output, and the integrator circuit includes a second operational amplifier having a positive input, a negative input, and an operational amplifier output, and the integrator circuit includes a first capacitive element coupled to the negative input and the operational amplifier output;
  a third resistive element having an input coupled to the gain stage output and having an output coupled to a second node;
  a fourth resistive element having an input coupled to the second node and an output coupled to ground;
  a second switch selectively coupling the second node to a third node; and
  a second capacitive element having an input coupled to the third node and an output coupled to ground, wherein the third node is coupled to the positive input of the second operational amplifier.

5. The capacitive sensor of claim 4, wherein the first resistive element, the second resistive element, the third resistive element, and the fourth resistive element each include substantially the same amount of resistance.

6. The capacitive sensor of claim 4, wherein the first capacitive element and the second capacitive element have substantially the same amount of capacitance.

7. The capacitive element of claim 4, wherein the first operational amplifier and the second operational amplifier each generate substantially the same amount of noise.

8. A capacitive sensor comprising:
  a capacitive sensor output;
  a gain stage including a first capacitive element, a second capacitive element, a first operational amplifier, and a gain stage output, the gain stage configured to generate a first signal having a first noise component and generate a second signal having an output component of the gain stage and the first noise component; and
  an active filtered-sampling stage having an input coupled to the gain stage output, the active filtered-sampling stage including:
    a first resistive element having an input coupled to the gain stage output and an output coupled to a first node;
    a second resistive element having an input coupled to the first node and an output coupled to the capacitive sensor output;
    an integrator circuit having a second operational amplifier, an integrator circuit input, and an integrator circuit output, wherein the integrator circuit output is coupled to the capacitive sensor output; and
    a first switch selectively coupling the first node to the integrator circuit input, wherein during normal operations in which the capacitive sensor is to produce a voltage output proportional to a capacitive difference of the first and second capacitive elements, the first switch is controlled, at a first time, to couple the first node to the second operational amplifier, resulting in the integrator circuit sampling the first signal that includes the first noise component, and the first switch is controlled, at a second time, to decouple the first node from the second operational amplifier, resulting in a second signal that includes a second noise component from the second amplifier being subtracted from the first signal so that an output signal produced at the capacitive sensor output includes the first noise component plus noise from the first switch minus the second noise component.

9. The capacitive sensor of claim 8, wherein the integrator circuit also includes a second operational amplifier that includes a positive input, a negative input, and an operational amplifier output, wherein the integrator circuit input is coupled to the negative input, the operational amplifier output is coupled to the integrator circuit output, and the integrator circuit also includes a first capacitive element coupled to the negative input and the operational amplifier output.

10. The capacitive sensor of claim 9, wherein the first resistive element and the second resistive element each have a resistance in a range of 10 k$\Omega$ to 100 k$\Omega$.

11. A capacitive sensor comprising:
  a capacitive sensor output;
  a gain stage including a first operational amplifier and a gain stage output, the gain stage configured to generate a first signal having a noise component and generate a second signal having an output component of the gain stage and the noise component;
  an active filtered-sampling stage having an input coupled to the gain stage output, the active filtered-sampling stage including:
    a first resistive element having an input coupled to the gain stage output and an output coupled to a first node;
    a second resistive element having an input coupled to the first node and an output coupled to the capacitive sensor output;
    an integrator circuit having an integrator circuit input and an integrator circuit output, wherein the integrator circuit output is coupled to the capacitive sensor output, and wherein the integrator circuit also includes a second operational amplifier that includes a positive input, a negative input, and an operational amplifier output, wherein the integrator circuit input is coupled to the negative input, the operational amplifier output is coupled to the integrator circuit output, and the integrator circuit also includes a first capacitive element coupled to the negative input and the operational amplifier output;
    a first switch selectively coupling the first node to the integrator circuit input;
    a third resistive element having an input coupled to the gain stage output and having an output coupled to a second node;
    a fourth resistive element having an input coupled to the second node and an output coupled to ground;
    a second switch selectively coupling the second node to a third node; and
    a second capacitive element having an input coupled to the third node and an output coupled to ground, wherein the third node is coupled to the positive input of the second operational amplifier.

12. The capacitive sensor of claim 11, wherein the first resistive element, the second resistive element, the third resistive element, and the fourth resistive element each include substantially the same amount of resistance.

13. The capacitive sensor of claim 11, wherein the first capacitive element and the second capacitive element have substantially the same amount of capacitance.

* * * * *